(12) United States Patent
Saino

(10) Patent No.: US 9,461,053 B2
(45) Date of Patent: Oct. 4, 2016

(54) SEMICONDUCTOR DEVICE

(71) Applicant: PS4 Luxco S.a.r.l., Luxembourg (LU)

(72) Inventor: Kanta Saino, Tokyo (JP)

(73) Assignee: PS4 LUXCO S.A.R.L., Luxembourg (LU)

( * ) Notice: Subject to any disclaimer, the term of this patent is extended or adjusted under 35 U.S.C. 154(b) by 0 days.

(21) Appl. No.: 14/767,794

(22) PCT Filed: Feb. 14, 2014

(86) PCT No.: PCT/JP2014/053479
§ 371 (c)(1),
(2) Date: Aug. 13, 2015

(87) PCT Pub. No.: WO2014/126201
PCT Pub. Date: Aug. 21, 2014

(65) Prior Publication Data
US 2015/0380416 A1 Dec. 31, 2015

(30) Foreign Application Priority Data
Feb. 15, 2013 (JP) .................. 2013-027793

(51) Int. Cl.
| | |
|---|---|
| H01L 29/66 | (2006.01) |
| H01L 27/108 | (2006.01) |
| G11C 11/408 | (2006.01) |
| H01L 27/02 | (2006.01) |

(Continued)

(52) U.S. Cl.
CPC ..... *H01L 27/10897* (2013.01); *G11C 11/4085* (2013.01); *G11C 11/4097* (2013.01);
(Continued)

(58) Field of Classification Search
CPC .............. H01L 27/10897; H01L 27/10817; H01L 27/0207; H01L 27/10852; H01L 27/10894; H01L 28/91; G11C 11/4085; G11C 11/4097
USPC .............. 257/337, 366, 368, 369, 372, 374, 257/E27.067, E21.582; 438/277, 279, 289, 438/305, 280; 365/182, 72
See application file for complete search history.

(56) References Cited

U.S. PATENT DOCUMENTS 6,198,128 B1 3/2001 Asakura et al.
8,614,490 B2 * 12/2013 Yoshimura ...... H01L 21/823425
257/394

(Continued)

FOREIGN PATENT DOCUMENTS

| | | |
|---|---|---|
| JP | 2000236074 | 8/2000 |
| JP | 2013254860 | 12/2013 |

OTHER PUBLICATIONS

Application No. PCT/JP2014/053479, International Search Report, Apr. 8, 2014.

*Primary Examiner* — Thinh T Nguyen
(74) *Attorney, Agent, or Firm* — Kunzler Law Group, PC

(57) ABSTRACT

Disclosed embodiments relate to a semiconductor device having a plurality of unit transistors that include element isolation regions formed on a semiconductor substrate and a gate electrode formed in the shape of a frame and disposed on an active region sandwiched between the element isolation regions in such a way that the two ends of the outer periphery of the gate electrode extend onto the element isolation regions and the inner periphery thereof closes the active region. The active regions of unit transistors adjacent to one another in a first direction are electrically isolated from one another by means of the element isolation regions, and the active regions of unit transistors adjacent to one another in a second direction which intersects the first direction are linked to one another.

14 Claims, 16 Drawing Sheets

(51) Int. Cl.
*G11C 11/4097* (2006.01)
*H01L 21/768* (2006.01)
*H01L 21/8234* (2006.01)

(52) U.S. Cl.
CPC ..... *H01L27/0207* (2013.01); *H01L 21/76895* (2013.01); *H01L 21/82345* (2013.01); *H01L 27/10817* (2013.01); *H01L 27/10852* (2013.01); *H01L 27/10894* (2013.01)

(56) References Cited

U.S. PATENT DOCUMENTS

2002/0033505 A1    3/2002   Kujirai et al.
2010/0197097 A1*   8/2010   Hasunuma ...... H01L 21/823437
                                                    438/284
2011/0266603 A1   11/2011   Nakamura et al.

* cited by examiner

[A-A´]

(a)

(b)

(c)

[A–A′]

(a)

(b)

(c)

(a) A–A'

(b) B–B'

(c) C–C'

[A—A´]

(a)

(b)

(c)

[A-A']

(a)

(b)

(c)

SEMICONDUCTOR DEVICE

TECHNICAL FIELD

NOTICE REGARDING RELATED APPLICATION

The present invention is based upon the priority claim of Japanese patent application No. 2013-027793 (filed on Feb. 15, 2013), the disclosure of which is incorporated herein in its entirety by reference thereto.

The present invention relates to a semiconductor device.

BACKGROUND

Reducing standby currents in a DRAM (Dynamic Random Access Memory) is particularly important in applications in which battery drive is assumed, including applications for mobile terminals. Of the standby currents in a DRAM, Icc2ps in particular is correlated with a leakage current which flows when the transistor is off, and is determined by a sub-threshold current (a current which flows before the channel turns on when a voltage is applied to the gate), a GIDL (Gate-Induced-Drain-Leakage current) and a junction leakage current. In particular, in a circuit (sub-word driver SWD) which drives a word line (sub-word line SWL) of a memory cell, the applied voltage Vpp is high (approximately 2.5 to 3 V), and therefore many leakage components are attributable to the GIDL. It is therefore important to reduce the GIDL in the sub-word driver SWD in order to lower the Icc2ps. In particular, in a state in which the sub-word line SWL is not selected, the OFF current of pMOS transistors in the sub-word driver SWD must be reduced. Suppressing the GIDL in the pMOS transistors is therefore directly coupled to reducing the Icc2ps.

With regard to the layout of a pMOS transistor in a conventional sub-word driver SWD, there are those that comprise U-shaped (C-shaped) gate electrodes 52a and 52b, first diffusion layers 51a and 51b provided inside the U-shapes of the gate electrodes 52a and 52b, a second diffusion layer 51c provided outside the U-shapes of the gate electrodes 52a and 52b, contact plugs 53a and 53b for bit lines, formed on the first diffusion layers 51a and 51b, and a contact plug 53c for a capacitor, formed on the second diffusion layer 51c (see FIG. 15 and FIG. 16; see FIG. 4 (b) and FIG. 20 of patent literature article 1, for example). In a standby current Icc2ps state, GND is applied to the second diffusion layer 51c serving as a source, Vkk is applied to the first diffusion layers 51a and 51b serving as drains, and Vpp is applied to the gate electrodes 52a and 52b and to a semiconductor substrate 101. Therefore a gate-source voltage Vgs=|Vpp| and a gate-drain voltage Vd=|Vpp|+|Vkk| are applied, and a GIDL is liable to occur in the standby current Icc2ps state.

With regard to the layout of pMOS transistors, attempts have been made to reduce GIDLs by providing, between the channel and the first diffusion layers 51a and 51b and the second diffusion layer 51c, an extension region 110 having the same conduction type as the first diffusion layers 51a and 51b and the second diffusion layer 51c, and having a lower impurity concentration than the first diffusion layers 51a and 51b and the second diffusion layer 51c, and adopting a halo structure in which a pocket-implant region 111 having the opposite conduction type to the first diffusion layers 51a and 51b and the second diffusion layer 51c and having a higher impurity concentration than that of a well is provided in a location that is deeper than the extension region 110, thereby relaxing the electric fields at the end portions of the gate electrodes 52a and 52b. Normally the extension region 110 is formed by ion implantation using a tilt angle (the angle at which the normal to the main surface of the semiconductor substrate 101 intersects the ion beam) of 0 degrees, and the pocket-implant region 111 is formed by ion implantation using a desired tilt angle.

PATENT LITERATURE

Patent literature article 1: Japanese Patent Kokai 1996-236718

BRIEF SUMMARY

The disclosures in the abovementioned patent literature are incorporated herein by reference.

The following analysis is provided by the inventor in the present application.

However, if ion implantation is performed using a conventional method, the ion concentration in the extension region 110 is weakened, and therefore the parasitic resistance increases and the ON current Ion decreases.

Further, if the ion implantation is performed using a conventional method, then because the diffusion coefficient of the boron B used for the ion implantation of the extension region 110, the first diffusion of the PMOS transistor layers 51a and 51b and the second diffusion layer 51c is large, the junctions are liable to become deeper, and there is therefore a tendency for short channel effects to increase and for the threshold voltage Vt to decrease, and it is thus difficult to form a transistor having a small gate length.

In order to suppress such boron B diffusion, an LDD (Lightly Doped Drain) region having an ion concentration that is weaker than that of the extension region 110 is sometimes formed instead of the extension region 110 and the pocket-implant region 111, and carbon C is implanted into the LDD region, but using this method there is conversely an increase in GIDLs attributable to crystal defects and an electric field intensity generated in the semiconductor substrate (silicon substrate), and it is therefore difficult to use such methods for pMOS transistors in sub-word drivers SWD.

For the reasons described hereinabove, using conventional methods, the gate length of the pMOS transistors in sub-word drivers SWD must inevitably be increased, impeding reductions in the chip size.

In one aspect of the present invention, a semiconductor device is provided with a plurality of unit transistors comprising: element isolation regions formed on a semiconductor substrate; and a gate electrode which is formed in the shape of a frame and is disposed on an active region sandwiched between the element isolation regions, in such a way that the two ends of the outer periphery of the gate electrode extend onto the element isolation regions and the inner periphery thereof closes the active region; wherein the active regions of unit transistors adjacent to one another in a first direction are electrically isolated from one another by means of the element isolation regions, and the active regions of unit transistors adjacent to one another in a second direction which intersects the first direction are linked to one another.

According to the present invention, GIDLs can be reduced while the ON current Ion is maintained, in a unit transistor. Further, the gate length of the gate electrode can be reduced, and the chip size can therefore be scaled down.

DETAILED DESCRIPTION

[Mode of Embodiment 1]

Figure 1:
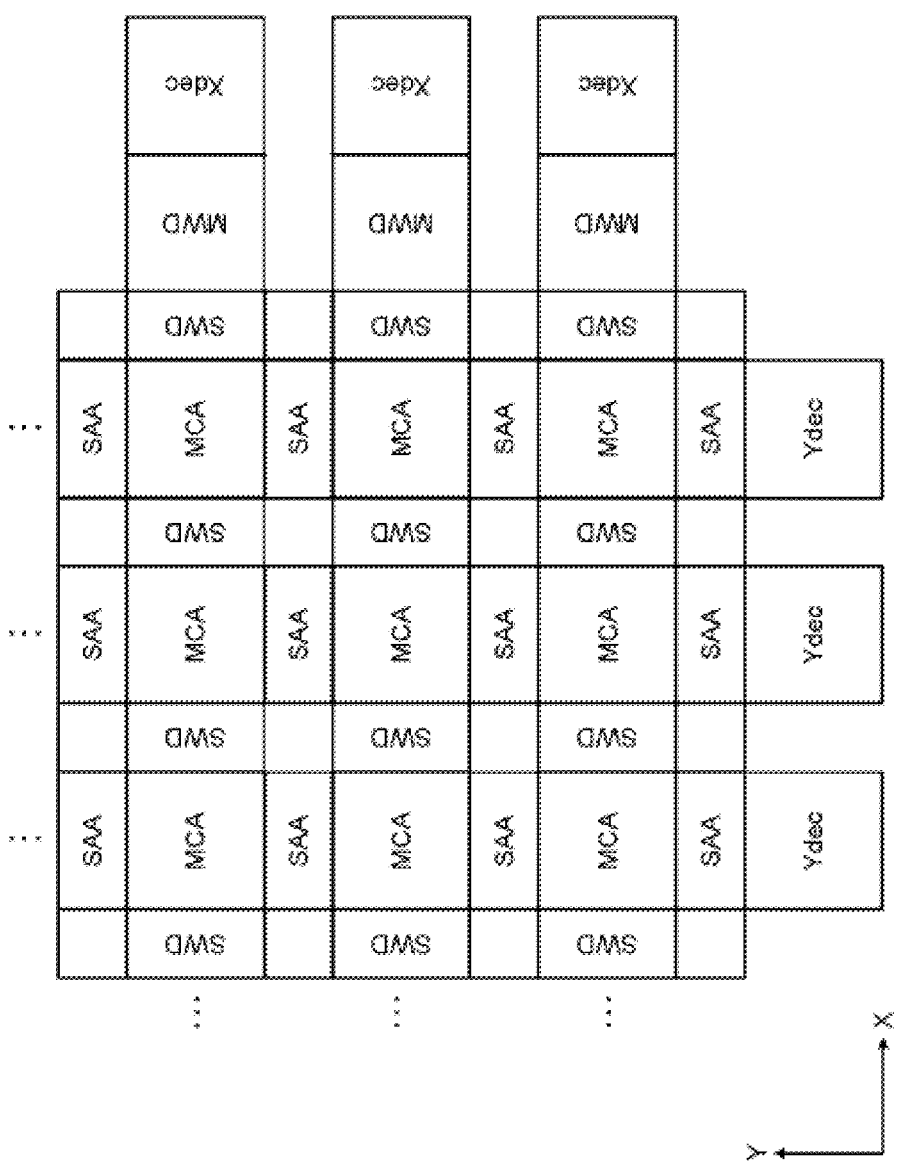
FIG. 1 is a drawing illustrating schematically an example of the arrangement of some memory cell arrays and peripheral circuits in a semiconductor device according to an mode of embodiment 1 of the present invention.
Figure 2:
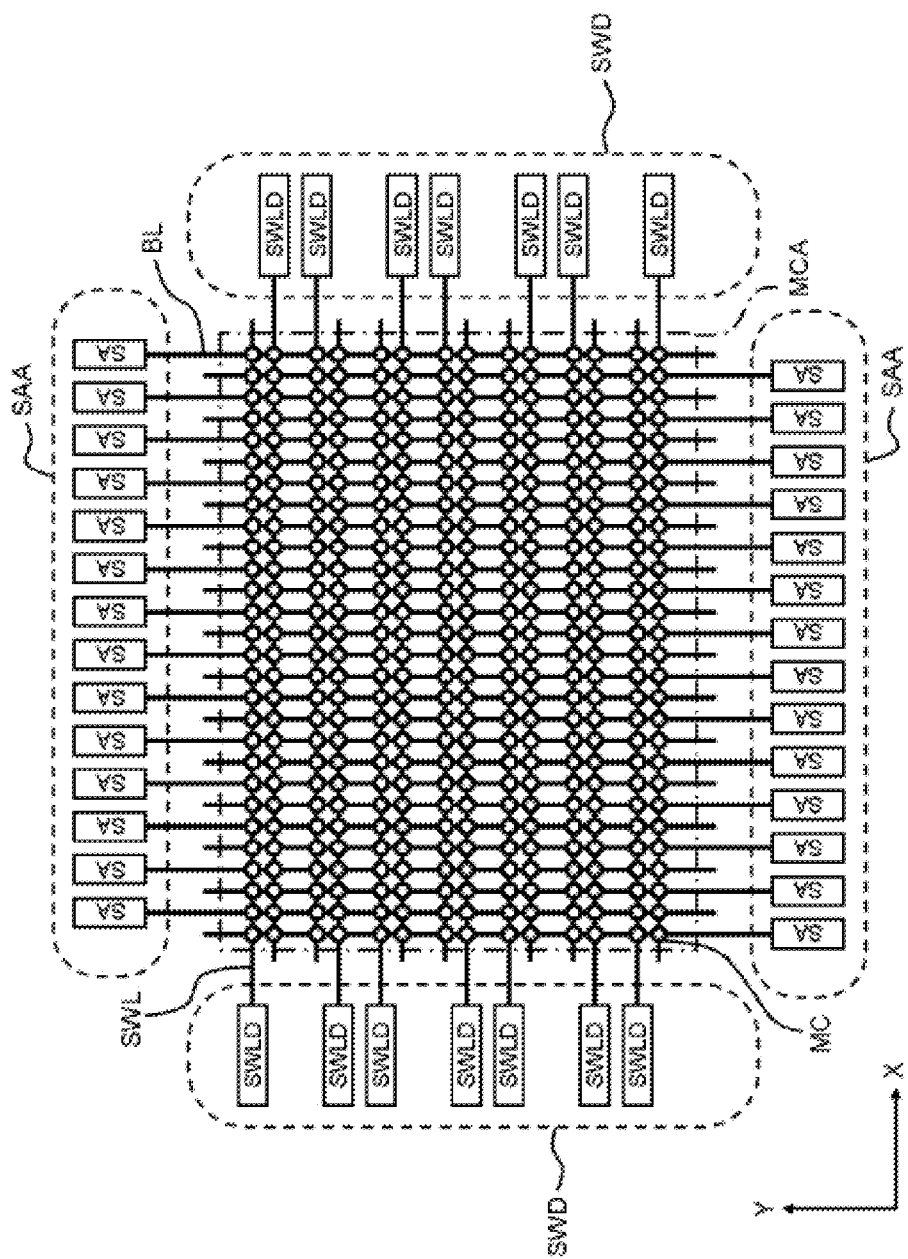
FIG. 2 is a drawing illustrating schematically an example of the arrangement of bit lines and word lines in a memory cell array in the semiconductor device according to mode of embodiment 1 of the present invention.

A semiconductor device according to mode of embodiment 1 of the present invention will now be described with reference to the drawings. FIG. 1 is a drawing illustrating schematically an example of the arrangement of some memory cell arrays and peripheral circuits in a semiconductor device according to mode of embodiment 1 of the present invention. FIG. 2 is a drawing illustrating schematically an example of the arrangement of bit lines and word lines in a memory cell array in the semiconductor device according to mode of embodiment 1 of the present invention.

The semiconductor device according to mode of embodiment 1 is a semiconductor memory device (semiconductor memory) capable of storing information in circuits formed from semiconductor elements. The semiconductor device has memory cell arrays MCA, and as peripheral circuits of the memory cell arrays MCA it has row decoders Xdec, main-word drivers MWD, sub-word drivers SWD, column decoders Ydec and sense amplifier arrays SAA (see FIG. 1).

The memory cell arrays MCA are arrays in which memory cells MC are disposed in a matrix formation in a plurality of rows and a plurality of columns (see FIG. 1 and FIG. 2). The memory cell arrays MCA themselves are also disposed in a matrix formation in a plurality of rows and a plurality of columns. The memory cell arrays MCA comprise the memory cells MC, sub-word lines SWL and bit lines BL.

The memory cells MC are cells in which circuits required to accumulate one bit of information are formed (see FIG. 2). The memory cells MC are provided at each point of intersection (they may also be provided in the vicinity of the points of intersection) of the sub-word lines SWL and the bit lines BL. For the memory cell MC, it is possible to use, for example, one in which a selection transistor (which is not shown in the drawings) and a storage element (which is not shown in the drawings; a capacitor or a variable-resistance element) are electrically connected in series between a common source line (which is not shown in the drawings) and the bit line BL, and in which the gate electrode of the selection transistor is electrically connected to the sub-word line SWL. The memory cells MC are electrically connected to the corresponding sub-word line SWL and bit line BL. It should be noted that the common source line supplies a common reference potential to each memory cell MC.

The sub-word lines SWL are provided extending in the X-direction and aligned side-by-side in the Y-direction (see FIG. 2). Each sub-word line SWL is electrically connected to a corresponding sub-word line driver SWLD in one of the sub-word drivers SWD disposed at both ends, in the X-direction, of the memory cell array MCA.

The bit lines BL are provided extending in the Y-direction and aligned side-by-side in the X-direction (see FIG. 2). Each bit line BL is electrically connected to a corresponding sense amplifier SA in one of the sense amplifier arrays SAA disposed at both ends, in the Y-direction, of the memory cell array MCA.

The row decoders Xdec are circuits which decode signals (encoded row addresses) from an array control circuit (which is not shown in the drawings) and a row address buffer (which is not shown in the drawings) (see FIG. 1). The row decoders Xdec output the decoded signals (row addresses) to the main-word drivers MWD.

The main-word drivers MWD are circuits for selecting the sub-word driver SWD belonging to the signal (row address) from the row decoder Xdec (see FIG. 1). The main-word drivers MWD select the corresponding sub-word driver SWD on the basis of the signal (row address) from the row decoder Xdec, and output a signal (row address) to the selected sub-word driver SWD.

The sub-word drivers SWD are circuits for selecting a memory cell belonging to a certain row in the memory cell array MCA (see FIG. 1 and FIG. 2). The sub-word drivers SWD are disposed on both sides, in the X-direction, of the memory cell arrays MCA. The sub-word drivers SWD comprise a plurality of sub-word line drivers SWLD. The sub-word line drivers SWLD are electrically connected to the corresponding sub-word lines SWL. On the basis of the row address from the main-word driver MWD, the sub-word driver SWD activates the sub-word line driver SWLD corresponding to said row address, and selects the row address in the memory cell array MCA by means of the corresponding sub-word line SWL. Details of the configuration of the sub-word drivers SWD and the sub-word line drivers SWLD will be discussed hereinafter.

The column decoders Ydec are circuits which decode signals (encoded column addresses) from the array control circuit (which is not shown in the drawings) and a column address buffer (which is not shown in the drawings) (see FIG. 1). On the basis of the column address, the column decoder Ydec activates the corresponding bit line BL, and selects the column address in the memory cell array MCA by means of the bit line BL.

The sense amplifier arrays SAA are arrays in which a plurality of sense amplifiers SA are disposed (see FIG. 1 and FIG. 2). The sense amplifier arrays SAA are disposed on both sides, in the Y-direction, of the memory cell arrays MCA. The sense amplifier SA is a circuit which amplifies the electric potential of data read from the memory cell array MCA by way of the selected bit line BL. The sense amplifier SA outputs the data, the electric potential of which has been amplified, to a determining circuit (which is not shown in the drawings).

Figure 3:
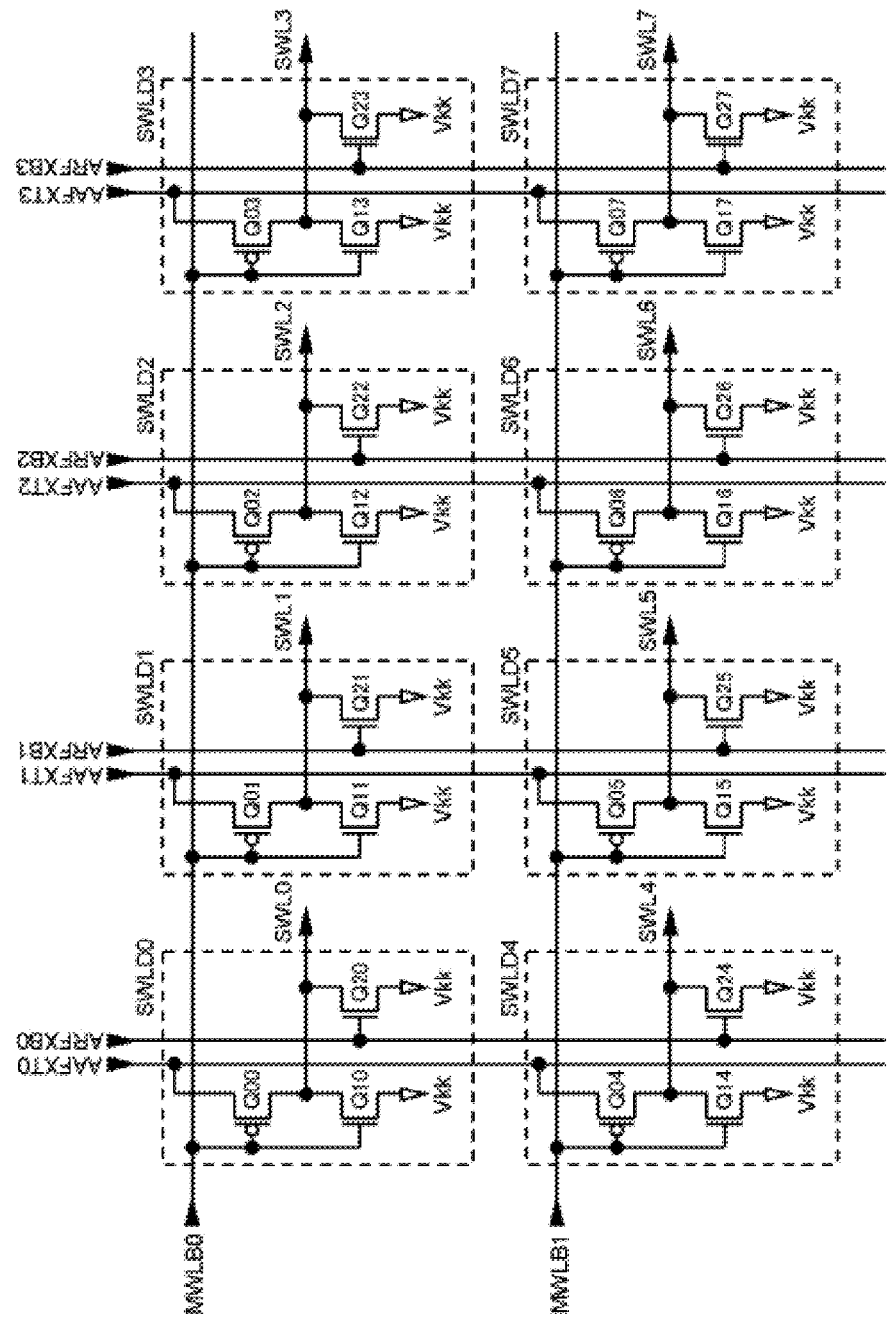
FIG. 3 is a drawing illustrating schematically an example of the circuit configuration of sub-word line drivers in peripheral circuits in the semiconductor device according to mode of embodiment 1 of the present invention.

The configuration of the sub-word drivers SWD and the sub-word line drivers SWLD in the semiconductor device according to mode of embodiment 1 of the present invention will now be described with reference to the drawings. FIG. 3 is a drawing illustrating schematically an example of the circuit configuration of the sub-word line drivers in the peripheral circuits in the semiconductor device according to mode of embodiment 1 of the present invention.

In the sub-word driver SWD, a plurality of sub-word line drivers SWLD0 to 7 are disposed in a matrix formation in a plurality of rows and a plurality of columns.

In the sub-word line driver SWLD0, a pMOS transistor Q00 and an nMOS transistor Q10 are electrically connected in series between an output signal line AAFXT0 and a reference potential line Vkk (0 to −0.5 V), and the nMOS transistor Q10 and an nMOS transistor Q20 are electrically connected in parallel between the pMOS transistor Q00 and the reference potential line Vkk. An address MWLB0 (row address) signal line from the main-word driver MWD is electrically connected to the gate electrodes of the pMOS transistor Q00 and the nMOS transistor Q10. A complementary output signal line ARFXB0 is electrically connected to the gate electrode of the nMOS transistor Q20. A sub-word line SWL0 is electrically connected to the source terminal of the pMOS transistor Q00, the drain terminal of the nMOS transistor Q10 and the drain terminal of the nMOS transistor Q20. The same applies to the other sub-word line drivers SWLD1 to 7.

It should be noted that the address MWLB0 signal line is electrically connected in common in the sub-word line drivers SWLD0 to 3. In the same way, an address MWLB1 signal line is also electrically connected in common in the sub-word line drivers SWLD4 to 7. Further, the output signal line AAFXT0 and the complementary output signal line ARFXB0 are electrically connected in common in the sub-word line driver SWLD0 and the sub-word line driver SWLD4.

Similarly, an output signal line AAFXT1 and a complementary output signal line ARFXB1 are also electrically connected in common in the sub-word line driver SWLD1 and the sub-word line driver SWLD5. Similarly, an output signal line AAFXT2 and a complementary output signal line ARFXB2 are also electrically connected in common in the sub-word line driver SWLD2 and the sub-word line driver SWLD6. Similarly, an output signal line AAFXT3 and a complementary output signal line ARFXB3 are also electrically connected in common in the sub-word line driver SWLD3 and the sub-word line driver SWLD7. The configuration of the pMOS transistors Q00 to 07 in the sub-word line drivers SWLD0 to 7 will be discussed hereinafter.

Figure 4:
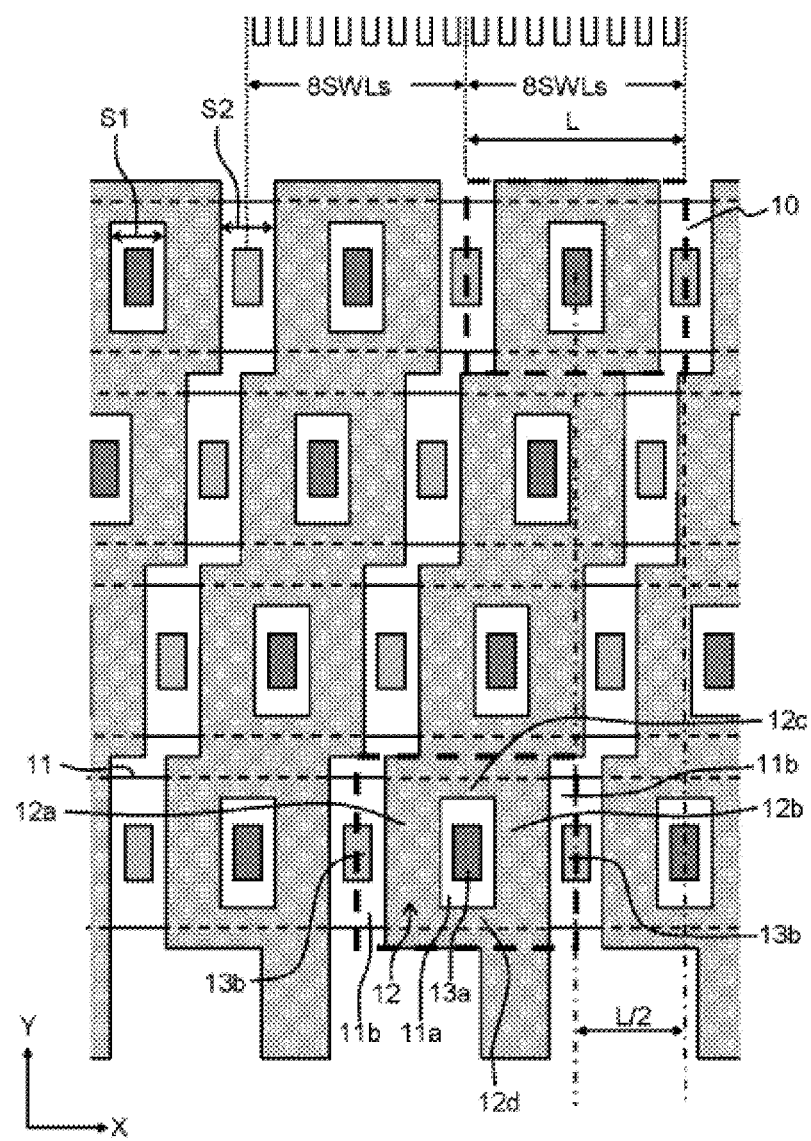
FIG. 4 is a drawing illustrating schematically an example of the layout of pMOS transistors in the sub-word line drivers in peripheral circuits in the semiconductor device according to mode of embodiment 1 of the present invention.
Figure 5:
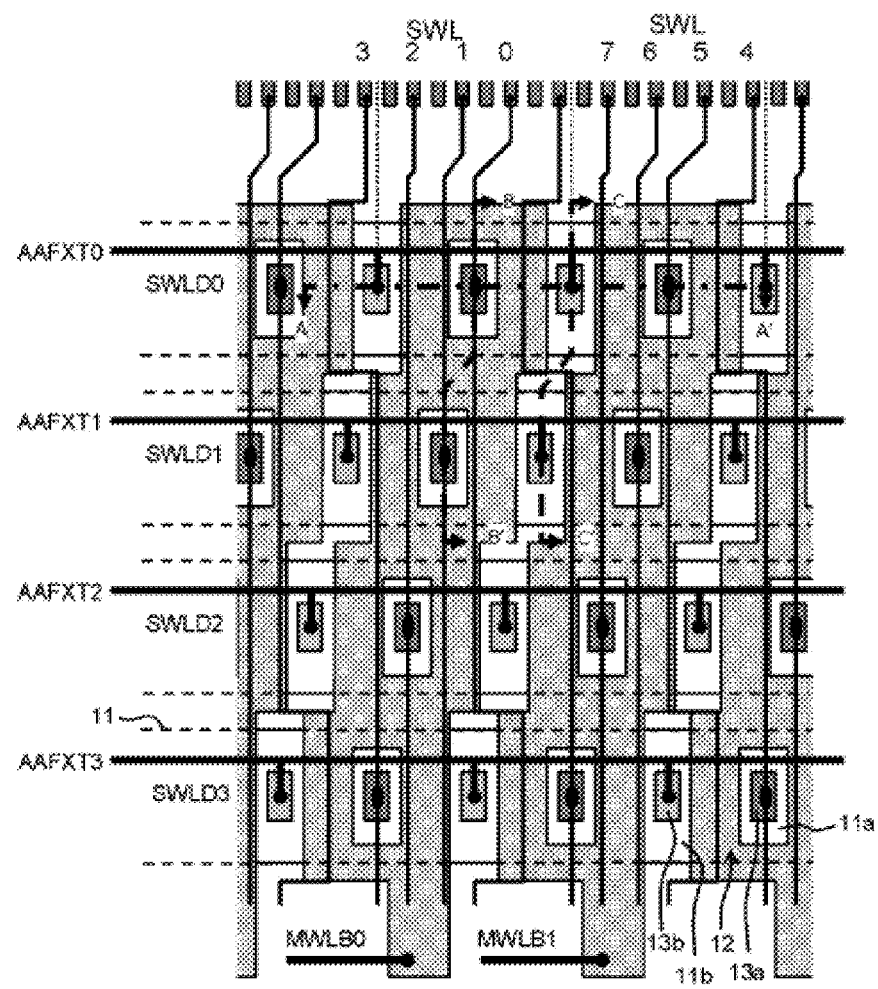
FIG. 5 is a drawing corresponding to FIG. 4, illustrating an example of the electrical connections between wiring lines and the pMOS transistors in the sub-word line drivers in the peripheral circuits in the semiconductor device according to mode of embodiment 1 of the present invention.
Figure 6:
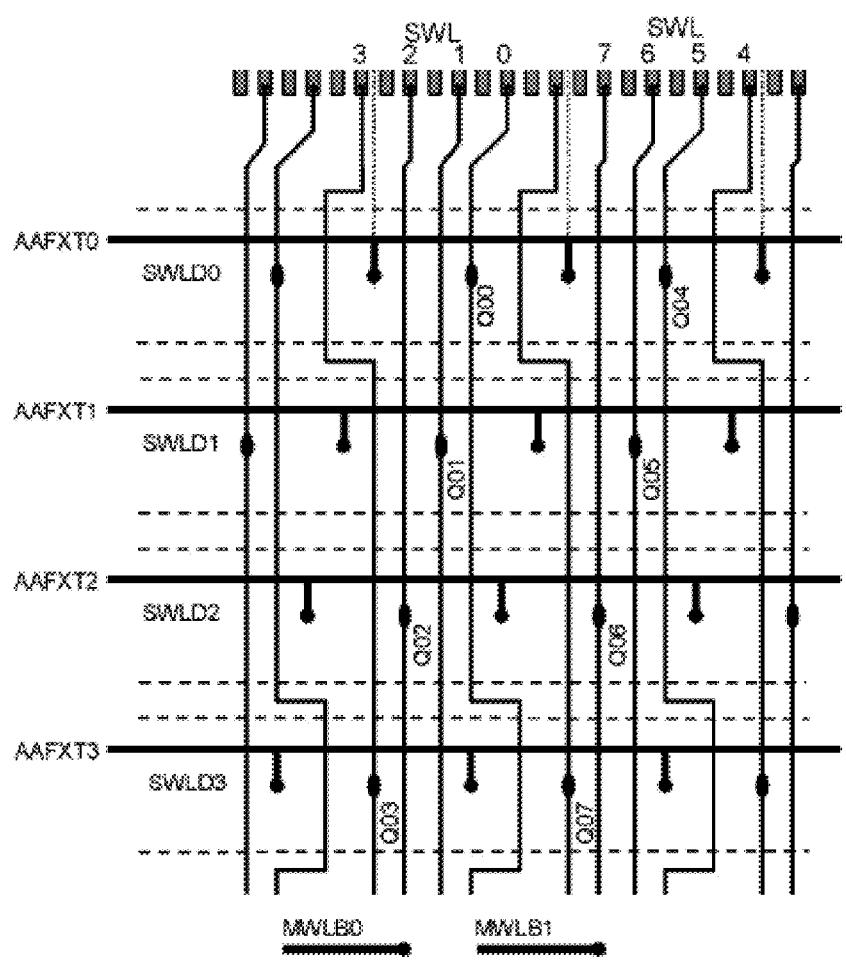
FIG. 6 is a drawing corresponding to FIG. 5, illustrating schematically an example of the layout of the wiring lines in the sub-word line drivers in the peripheral circuits in the semiconductor device according to mode of embodiment 1 of the present invention.
Figure 7:
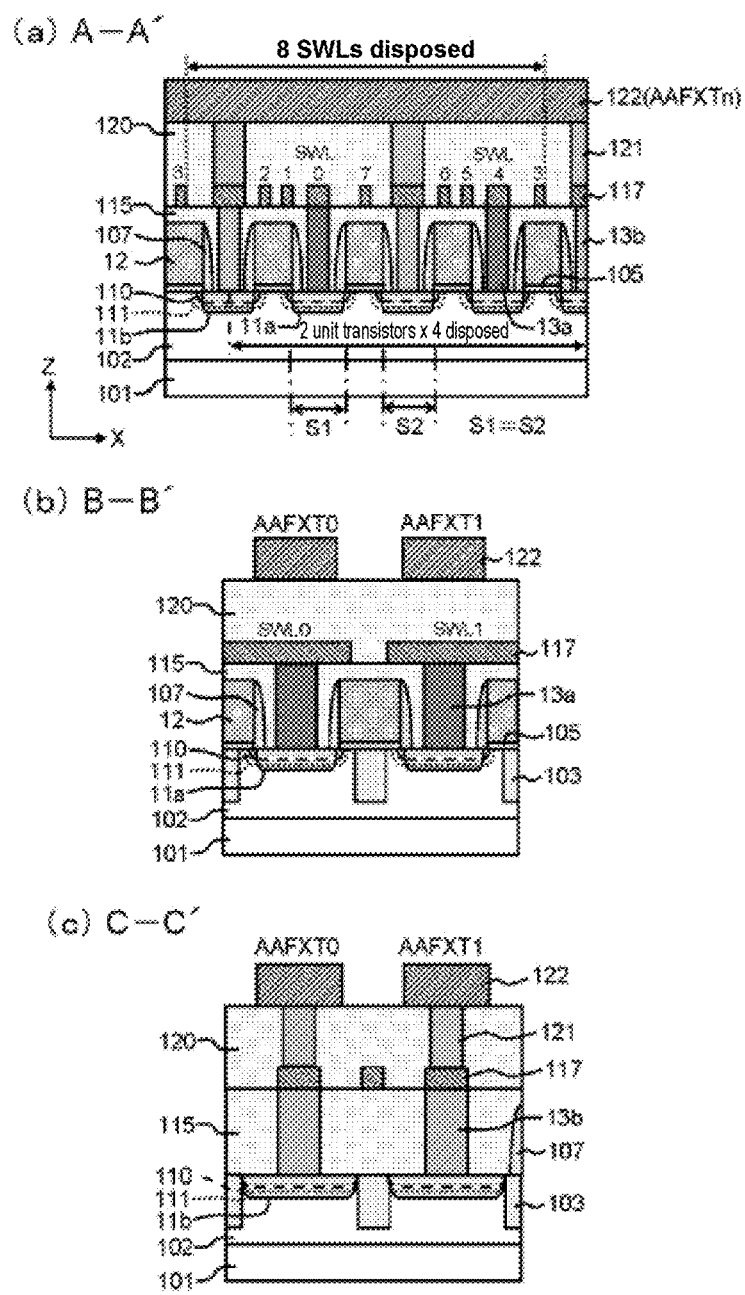
FIG. 7 illustrates schematically an example of the configuration of the pMOS transistors in the sub-word line drivers in the peripheral circuits in the semiconductor device according to mode of embodiment 1 of the present invention, being cross-sectional views through (a) A-A', (b) B-B' and (c) C-C' in FIG. 5.

The configuration of the pMOS transistors in the sub-word line drivers in the peripheral circuits in the semiconductor device according to mode of embodiment 1 of the present invention will now be described with reference to the drawings. FIG. 4 is a drawing illustrating schematically an example of the layout of the pMOS transistors in the sub-word line drivers in the peripheral circuits in the semiconductor device according to mode of embodiment 1 of the present invention. FIG. 5 is a drawing corresponding to FIG. 4, illustrating an example of the electrical connections between wiring lines and the pMOS transistors in the sub-word line drivers in the peripheral circuits in the semiconductor device according to mode of embodiment 1 of the present invention. FIG. 6 is a drawing corresponding to FIG. 5, illustrating schematically an example of the layout of the wiring lines in the sub-word line drivers in the peripheral circuits in the semiconductor device according to mode of embodiment 1 of the present invention. FIG. 7 illustrates schematically an example of the configuration of the pMOS transistors in the sub-word line drivers in the peripheral circuits in the semiconductor device according to mode of embodiment 1 of the present invention, being cross-sectional views through (a) A-A', (b) B-B' and (c) C-C' in FIG. 5.

As illustrated in FIG. 7, the pMOS transistors Q00 to 07 in the sub-word line drivers SWLD0 to 7 in FIG. 3 are formed on an n-well 102 formed on a semiconductor substrate 101. Element isolation regions 103, in which an insulator (for example a silicon dioxide film) is embedded in a groove formed in the shape of a line, are formed in prescribed positions in the n-well 102. The element isolation regions 103 are disposed in regions between active regions 11 illustrated in FIG. 4. Gate electrodes 12 (for example titanium nitride) are formed, with the interposition of gate insulating films 105 (for example silicon dioxide films), in prescribed positions on the n-well 102, including the element isolation regions 103.

As illustrated in FIG. 4, the gate electrodes 12 are formed in the regions of unit transistors 10, in the shape of frames (picture frames) disposed on active regions sandwiched between the element isolation regions 103, in such a way that both ends of the outer peripheries of the gate electrodes 12 extend over the element isolation regions 103, and the inner peripheries close the active regions, wherein the gate electrodes 12 that are adjacent to one another in the Y-direction are connected to one another, offset in the X-direction, and the gate electrodes 12 that are adjacent to one another in the X-direction are separated from one another. The parts of the gate electrodes 12 on both sides, in the X-direction, of first diffusion layers 11a inside the frame shapes serve as first channel portions 12a and second channel portions 12b, and the parts on both sides, in the Y-direction, of the first diffusion layers 11a inside the frame shapes serve as first connecting portions 12c and second connecting portions 12d. In other words, the first connecting portions 12c and the second connecting portions 12d connect both ends, in the Y-direction, of the first channel portions 12a and the second channel portions 12b. Separations 51 in the X-direction between the gate electrodes 12, inside the frame shapes of the gate electrodes, are the same as separations S2 in the X-direction between the gate electrodes 12, outside the frame shapes of the gate electrodes (see FIG. 7). The gate electrodes 12 are electrically connected to wiring lines to which corresponding address signals MWLBn are input (see FIG. 5 and FIG. 6). It should be noted that the width L, in the X-direction, of the unit transistors 10 is the same as the width of eight sub-word lines SWL (see FIG. 4).

Side wall spacers 107 comprising insulators (for example silicon nitride films) are formed on the sidewall surfaces of the inner peripheries of the frame shapes and the outer peripheries of the frame shapes of the gate electrodes 12 (see FIG. 4 and FIG. 7). First diffusion layers 11a (p-type diffusion layers; for example layers in which boron B is diffused) are formed in regions inside the frame shapes of the gate electrodes 12 on the n-well 102. The second diffusion layers 11b (p-type diffusion layers; for example layers in which boron B is diffused) are formed in regions outside the frame shapes of the gate electrodes 12 on the n-well 102 (see FIG. 4 and FIG. 7). The separation, in the X-direction, between the centers of the first diffusion layers 11a and the centers of the second diffusion layers 11b is half of the width L (L/2), in the X-direction, of the unit transistors 10 (see FIG. 4).

Extension regions 110 are provided on the n-wells 102 in the vicinity of the peripheries of the first diffusion layers 11a and the second diffusion layers 11b, adjacent to the first diffusion layers 11a and the second diffusion layers 11b (including at least parts between the channel and the first diffusion layer 11a and second diffusion layer 11b). Pocket-implant regions 111 are provided on the n-wells 102 in positions that are deeper than the extension regions 110. The extension regions 110 are regions in which an impurity (for example boron B) having the same conduction type as the first diffusion layers 11a and the second diffusion layers 11b, and having a lower concentration than that of the first diffusion layers 11a and the second diffusion layers 11b, is diffused. The pocket-implant regions 111 are regions in which an impurity (for example phosphorus) having the opposite conduction type to the first diffusion layers 11a and the second diffusion layers 11b, and having a higher concentration than that of the n-well 102, is implanted and diffused. The extension regions 110 and the pocket-implant regions 111 are disposed below the side wall spacers 107 and extending to the vicinity thereof.

An interlayer insulating film 115 (for example a silicon dioxide film) is formed over the entire surface of the substrate, including the gate electrodes 12, the side wall spacers 107, the first diffusion layers 11a and the second diffusion layers 11b. Holes leading to the first diffusion layers 11a are formed in the interlayer insulating film 115, and contact plugs 13a (for example DOPOS, doped polysilicon) are embedded in said holes. Further, holes leading to the second diffusion layers 11b are formed in the interlayer insulating film 115, and contact plugs 13b (for example DOPOS, doped polysilicon) are embedded in said holes.

Wiring lines 117 (for example a tungsten nitride/tungsten laminated film) are formed in prescribed positions on the interlayer insulating film 115, including the contact plugs 13a, 13b. From among the wiring lines 117, the wiring lines that are to be electrically connected to the sub-word lines SWL0 to 7 are connected to the corresponding contact plugs 13a (see FIG. 5 and FIG. 6). From among the wiring lines 117, the wiring lines that are to be connected to the output signals AAFXTn are connected to the corresponding contact plugs 13b (see FIG. 5 and FIG. 6).

An interlayer insulating film 120 (for example a silicon dioxide film) is formed on the interlayer insulating film 115, including the wiring lines 117. Holes leading to the wiring lines 117 that are to be connected to the output signals AAFXTn are formed in the interlayer insulating film 120, and contact plugs 121 (for example DOPOS, doped polysilicon) are embedded in said holes.

Wiring lines 122, to be connected to the output signals AAFXTn, are formed on the interlayer insulating film 120, including the contact plugs 121. The wiring lines 122 are electrically connected to the second diffusion layers 11b by way of the contact plugs 121, the wiring lines 117 and the contact plugs 13b.

Figure 8:
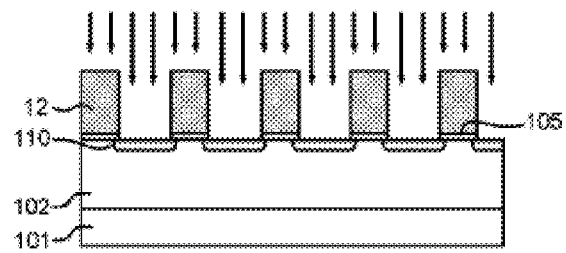
FIG. 8 is a process cross-sectional view corresponding to A-A' in FIG. 5, illustrating schematically an example of a method of manufacturing the pMOS transistors in the sub-word line drivers in the peripheral circuits in the semiconductor device according to mode of embodiment 1 of the present invention.
Figure 8:
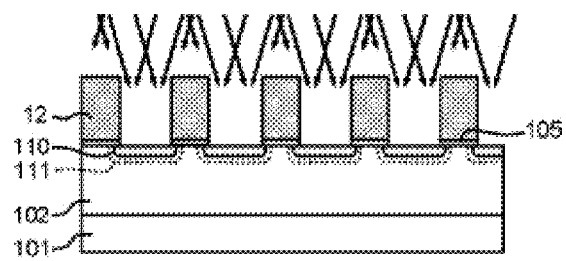
Figure 8:
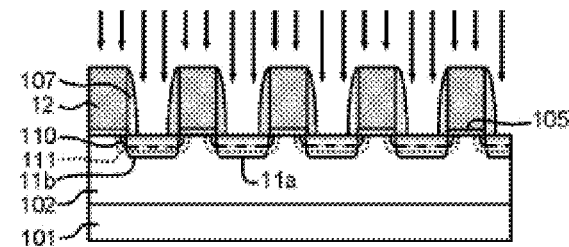

A method of manufacturing the pMOS transistors in the sub-word line drivers in the peripheral circuits in the semiconductor device according to mode of embodiment 1 of the present invention will now be described with reference to the drawings. FIG. 8 is a process cross-sectional view corresponding to A-A' in FIG. 5, illustrating schematically an example of a method of manufacturing the pMOS transistors in the sub-word line drivers in the peripheral circuits in the semiconductor device according to mode of embodiment 1 of the present invention.

An n-well 102 (for example a region in which phosphorus has been dispersed) is first formed on a semiconductor substrate 101 (for example a silicon substrate), after which gate electrodes 12 (for example titanium nitride) are formed on the n-well 102 with the interposition of gate insulating films 105 (for example a silicon dioxide film), after which portions of the gate electrodes 12 and the gate insulating films 105 are removed by lithography and dry etching (step A1).

Extension regions 110 are then formed by implanting an impurity (for example boron B) into the exposed n-well 102 with a tilt angle of 0 degrees (step A2; see FIG. 8 (*a*)).

Pocket-implant regions 111 are then formed by implanting an impurity (for example phosphorus) into the n-well 102 in a position that is deeper than the extension regions 110, using a desired tilt angle (step A3; see FIG. 8 (*b*)).

An insulating film (for example a silicon nitride film) for side wall spacers 107 is then deposited over the entire surface, including the extension regions 110, the gate electrodes 12 and the gate insulating films 105, after which said insulating film is etched back to form the side wall spacers 107 on the sidewall surfaces at the inner peripheries of the frame shapes of the gate electrodes 12 and the gate insulating films 105, and at the outer peripheries of said frame shapes, after which first diffusion layers 11*a* and second diffusion layers 11*b* are formed by implanting an impurity (for example boron B) into the n-well 102 from the exposed extension regions 110, with a tilt angle of 0 degrees (step A4; see FIG. 8 (*c*)).

Interlayer insulating films, contact plugs and wiring lines are then formed using conventional methods (step A5). In this way it is possible to manufacture the pMOS transistors in the sub-word line drivers, such as those in FIG. 7.

According to mode of embodiment 1, GIDLs can be reduced while the ON current Ion of the pMOS transistors Q00 to 07 is maintained. Further, the gate length of the sub-word drivers SWD can be scaled (scaled down), and the chip size can therefore be scaled down.

Further, according to mode of embodiment 1, by forming the pocket-implant regions 111 in the first diffusion layers 11*a* and the second diffusion layers 11*b* both inside the frame shapes of the gate electrodes 12 and outside said frame shapes, short channel effects can be suppressed, pMOS transistors having a shorter channel can be formed, and the chip surface area can be scaled down. To elaborate, by reducing the surface area of the chip that is occupied by the sub-word drivers SWD, the DRAM chip surface area can be scaled down, and the performance of the pMOS transistor can be improved.

Further, according to mode of embodiment 1, in the peripheral circuit portions, the extension regions 110 and the pocket-implant regions 111 can be formed using the same ion implantation, and the capabilities of the pMOS transistor can be maintained without increasing the cost.

Moreover, according to mode of embodiment 1, there is no increase in the number of ion implantation masks, and therefore the cost does not increase.

[Mode of Embodiment 2]

Figure 9:
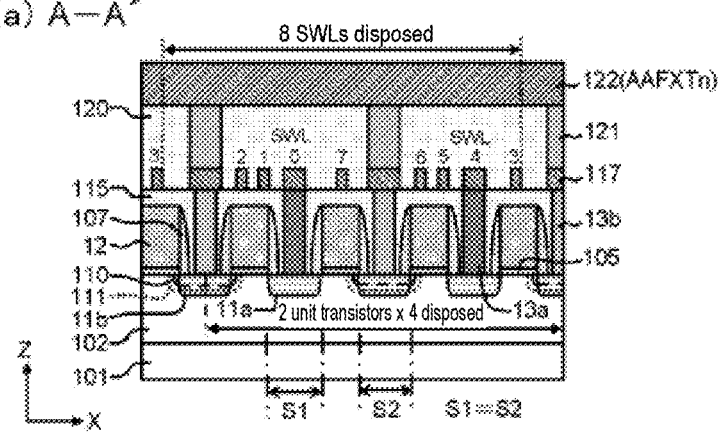
FIG. 9 illustrates schematically an example of the configuration of pMOS transistors in sub-word line drivers in peripheral circuits in a semiconductor device according to mode of embodiment 2 of the present invention, being cross-sectional views corresponding to (a) A-A', (b) B-B' and (c) C-C' in FIG. 5.
Figure 9:
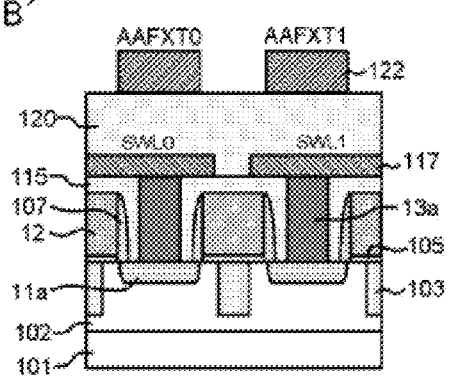
Figure 9:
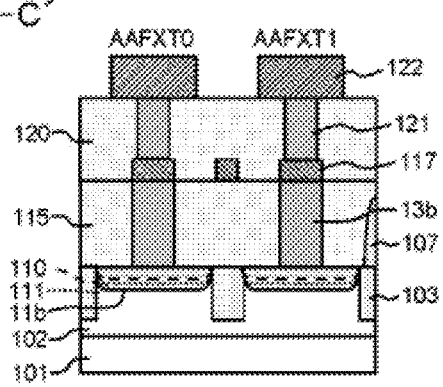

A semiconductor device according to mode of embodiment 2 of the present invention will now be described with reference to the drawings. FIG. 9 illustrates schematically an example of the configuration of pMOS transistors in sub-word line drivers in peripheral circuits in a semiconductor device according to mode of embodiment 2 of the present invention, being cross-sectional views corresponding to (a) A-A', (b) B-B' and (c) C-C' in FIG. 5.

Mode of embodiment 2 is a modified example of mode of embodiment 1, in which the extension regions 110 and the pocket-implant regions 111 are not formed at the peripheries of the first diffusion layers 11*a* of the pMOS transistors in the sub-word line drivers SWD, the extension regions 110 and the pocket-implant regions 111 are formed only at the peripheries of the second diffusion layers 11*b*, and the pMOS transistors have an asymmetric impurity profile. Other aspects of the configuration are the same as in mode of embodiment 1.

Figure 10:
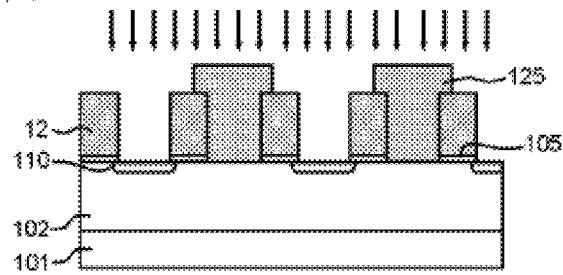
FIG. 10 is a process cross-sectional view corresponding to A-A' in FIG. 5, illustrating schematically an example of a method of manufacturing the pMOS transistors in the sub-word line drivers in the peripheral circuits in the semiconductor device according to mode of embodiment 2 of the present invention.
Figure 10:
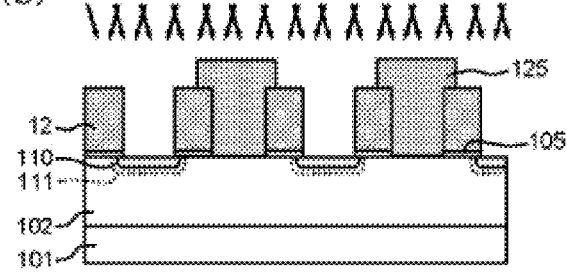
Figure 10:
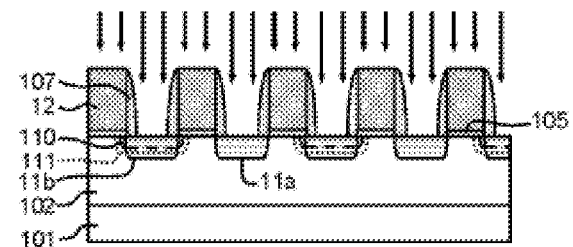

A method of manufacturing the pMOS transistors in the sub-word line drivers in the peripheral circuits in the semiconductor device according to mode of embodiment 2 of the present invention will now be described with reference to the drawings. FIG. 10 is a process cross-sectional view corresponding to A-A' in FIG. 5, illustrating schematically an example of a method of manufacturing the pMOS transistors in the sub-word line drivers in the peripheral circuits in the semiconductor device according to mode of embodiment 2 of the present invention.

An n-well 102 (for example a region in which phosphorus has been dispersed) is first formed on a semiconductor substrate 101 (for example a silicon substrate), after which gate electrodes 12 (for example titanium nitride) are formed on the n-well 102 with the interposition of gate insulating films 105 (for example a silicon dioxide film), after which portions of the gate electrodes 12 and the gate insulating films 105 are removed by lithography and dry etching (step B1).

A resist 125 covering regions in which first diffusion layers (11*a* in FIG. 10) are to be formed is formed next, after which extension regions 110 are formed only in regions in which second diffusion layers (11*b* in FIG. 10) are to be formed, by implanting an impurity (for example boron B) into the exposed n-well 102 with a tilt angle of 0 degrees, using the resist 125 as a mask (step B2; see FIG. 10 (*a*)).

Pocket-implant regions 111 are then formed only in the regions in which the second diffusion layers (11*b* in FIG. 10) are to be formed, by implanting an impurity (for example phosphorus) into the n-well 102 in a position that is deeper than the extension regions 110, using a desired tilt angle, with the resist 125 as a mask (step B3; see FIG. 10 (*b*)).

The resist (125 in FIG. 10 (*b*)) is then removed, after which an insulating film (for example a silicon nitride film) for side wall spacers 107 is deposited over the entire surface of the substrate, including the extension regions 110, the gate electrodes 12 and the gate insulating films 105, after which said insulating film is etched back to form the side wall spacers 107 on the sidewall surfaces at the inner peripheries of the frame shapes of the gate electrodes 12 and the gate insulating films 105, and at the outer peripheries of said frame shapes, after which first diffusion layers 11*a* and second diffusion layers 11*b* are formed by implanting an impurity (for example boron B) into the n-well 102 from the exposed n-well 102 and the extension regions 110, with a tilt angle of 0 degrees (step B4; see FIG. 10 (*c*)).

Interlayer insulating films, contact plugs and wiring lines are then formed using conventional methods (step B5). In this way it is possible to manufacture pMOS transistors in the sub-word line drivers, in which the profiles of the extension regions 110 and the pocket-implant regions 111 are asymmetrical, such as those in FIG. 9.

According to mode of embodiment 2, it is possible for pMOS transistors having an asymmetric impurity profile, in which there are no extension regions 110 or pocket-implant regions 111 in the first diffusion layers 11*a* inside the frame shapes of the gate electrodes 12, and there are extension regions 110 and pocket-implant regions 111 in the second diffusion layers 11*b* outside said frame shapes, to be formed in the sub-word drivers SWD, using the resist 125, and simultaneously for transistors having a symmetric impurity profile to be formed in the peripheral circuit portions. As a result, GIDLs generated in the first diffusion layers 11*a* inside the frame shapes in the sub-word drivers SWD can be reduced. Further, according to mode of embodiment 2, in the peripheral circuit portions, the extension regions 110 and the pocket-implant regions 111 can be formed using the same ion implantation, and the capabilities of the transistor can be maintained without increasing the cost.

[Mode of Embodiment 3]

Figure 11:
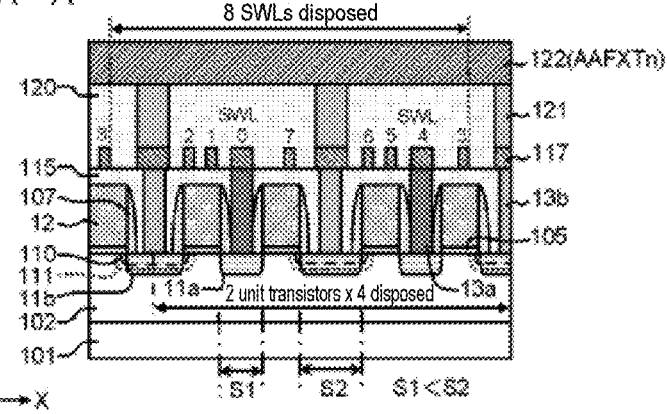
FIG. 11 illustrates schematically an example of the configuration of pMOS transistors in sub-word line drivers in peripheral circuits in a semiconductor device according to mode of embodiment 3 of the present invention, being cross-sectional views corresponding to (a) A-A', (b) B-B' and (c) C-C' in FIG. 5.
Figure 11:
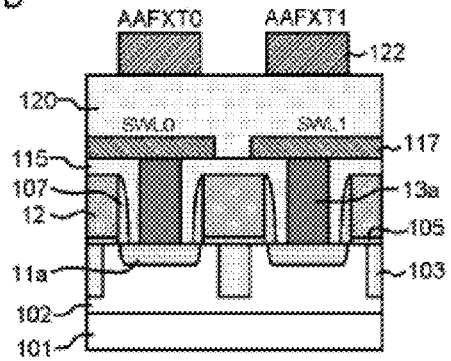
Figure 11:
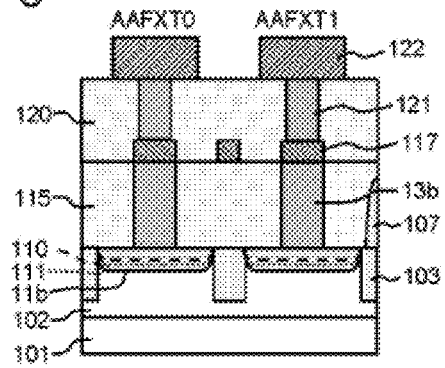

A semiconductor device according to mode of embodiment 3 of the present invention will now be described with reference to the drawings. FIG. 11 illustrates schematically an example of the configuration of pMOS transistors in sub-word line drivers in peripheral circuits in a semiconductor device according to mode of embodiment 3 of the present invention, being cross-sectional views corresponding to (a) A-A', (b) B-B' and (c) C-C' in FIG. 5.

Mode of embodiment 3 is a modified example of mode of embodiment 2, in which separations S1 in the X-direction between the gate electrodes 12, inside the frame shapes of the gate electrodes, are less than separations S2 in the X-direction between the gate electrodes 12, outside the frame shapes of the gate electrodes, and the width of the first diffusion layers 11a is less than the width of the second diffusion layers 11b. Further, the point that the extension regions 110 and the pocket-implant regions 111 are formed only at the peripheries of the second diffusion layers 11b, and the pMOS transistors thus have an asymmetric impurity profile, is the same as in mode of embodiment 2. Other aspects of the configuration are the same as in mode of embodiment 2.

Figure 12:
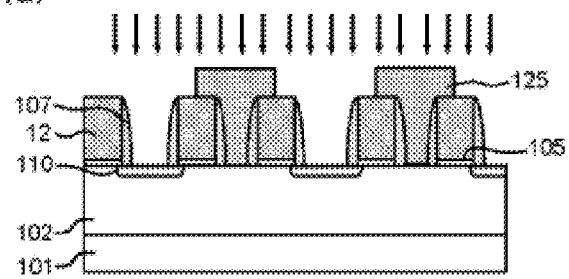
FIG. 12 is a process cross-sectional view corresponding to A-A' in FIG. 5, illustrating schematically an example of a method of manufacturing the pMOS transistors in the sub-word line drivers in the peripheral circuits in the semiconductor device according to mode of embodiment 3 of the present invention.
Figure 12:
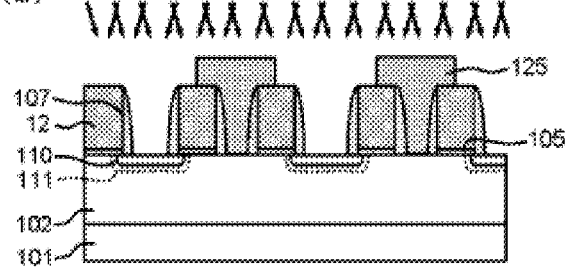
Figure 12:
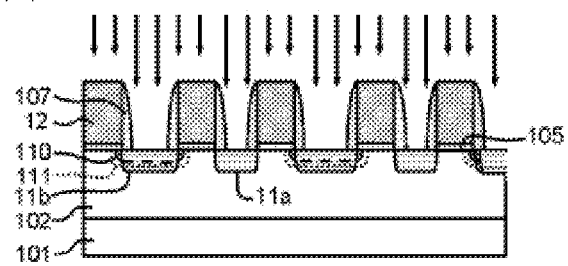

A method of manufacturing the pMOS transistors in the sub-word line drivers in the peripheral circuits in the semiconductor device according to mode of embodiment 3 of the present invention will now be described with reference to the drawings. FIG. 12 is a process cross-sectional view corresponding to A-A' in FIG. 5, illustrating schematically an example of a method of manufacturing the pMOS transistors in the sub-word line drivers in the peripheral circuits in the semiconductor device according to mode of embodiment 3 of the present invention.

An n-well 102 (for example a region in which phosphorus has been dispersed) is first formed on a semiconductor substrate 101 (for example a silicon substrate), after which gate electrodes 12 (for example titanium nitride) are formed on the n-well 102 with the interposition of gate insulating films 105 (for example a silicon dioxide film), after which portions of the gate electrodes 12 and the gate insulating films 105 are removed by lithography and dry etching, after which an insulating film (for example a silicon nitride film) for side wall spacers 107 is deposited over the entire surface of the substrate, including the n-well 102, the gate electrodes 12 and the gate insulating films 105, after which said insulating film is etched back to form the side wall spacers 107 on the sidewall surfaces at the inner peripheries of the frame shapes of the gate electrodes 12 and the gate insulating films 105, and at the outer peripheries of said frame shapes (step C1).

A resist 125 covering regions in which first diffusion layers (11a in FIG. 12) are to be formed is formed next, after which extension regions 110 are formed only in regions in which second diffusion layers (11b in FIG. 12) are to be formed, by implanting an impurity (for example boron B) into the exposed n-well 102 with a tilt angle of 0 degrees, using the resist 125 as a mask (step C2; see FIG. 12 (a)).

Pocket-implant regions 111 are then formed only in the regions in which the second diffusion layers (11b in FIG. 12) are to be formed, by implanting an impurity (for example phosphorus) into the n-well 102 in a position that is deeper than the extension regions 110, using a desired tilt angle, with the resist 125 as a mask (step C3; see FIG. 12 (b)).

The resist (125 in FIG. 12 (b)) is then removed, after which the first diffusion layers 11a and the second diffusion layers 11b are formed by implanting an impurity (for example boron B) into the n-well 102 from the exposed n-well 102 and the extension regions 110, with a tilt angle of 0 degrees (step C4; see FIG. 12 (c)).

Interlayer insulating films, contact plugs and wiring lines are then formed using conventional methods (step C5). In this way it is possible to manufacture pMOS transistors in which the width of the first diffusion layers 11a is less than the width of the second diffusion layers 11b, and in which, in the sub-word line drivers, the profiles of the extension regions 110 and the pocket-implant regions 111 are asymmetrical, such as those in FIG. 11.

According to mode of embodiment 3, the same advantages are exhibited as in mode of embodiment 2.

[Mode of Embodiment 4]

Figure 13:
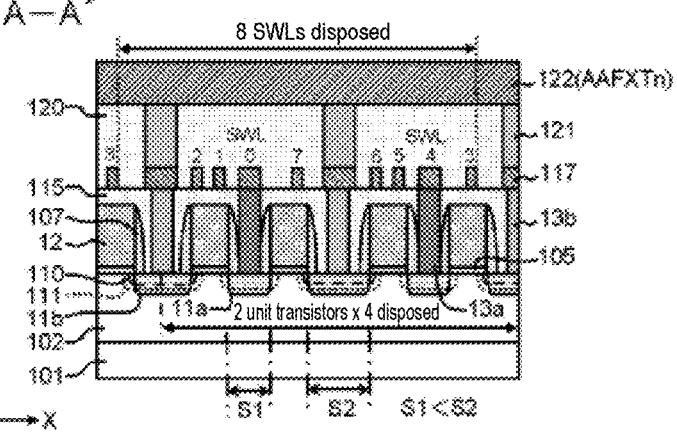
FIG. 13 illustrates schematically an example of the configuration of pMOS transistors in sub-word line drivers in peripheral circuits in a semiconductor device according to mode of embodiment 4 of the present invention, being cross-sectional views corresponding to (a) A-A', (b) B-B' and (c) C-C' in FIG. 5.
Figure 13:
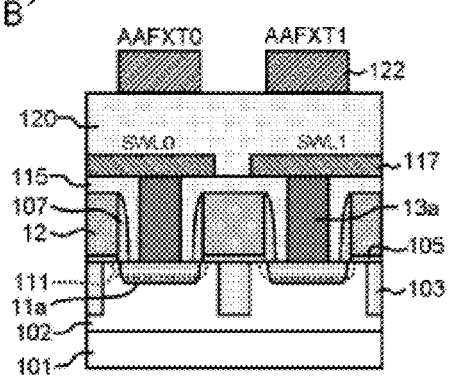
Figure 13:
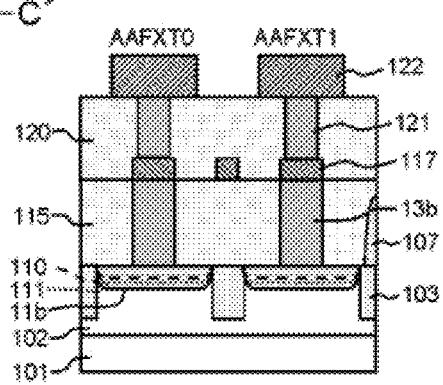

A semiconductor device according to mode of embodiment 4 of the present invention will now be described with reference to the drawings. FIG. 13 illustrates schematically an example of the configuration of pMOS transistors in sub-word line drivers in peripheral circuits in a semiconductor device according to mode of embodiment 4 of the present invention, being cross-sectional views corresponding to (a) A-A', (b) B-B' and (c) C-C' in FIG. 5.

Mode of embodiment 4 is a modified example of mode of embodiment 3, in which the pocket-implant regions 111 are formed at the peripheries of the first diffusion layers 11a. The point that separations S1 in the X-direction between the gate electrodes 12, inside the frame shapes of the gate electrodes, are less than separations S2 in the X-direction between the gate electrodes 12, outside the frame shapes of the gate electrodes, and the point that the width of the first diffusion layers 11a is less than the width of the second diffusion layers 11b, are the same as in mode of embodiment 3. Further, the point that the extension regions 110 and the pocket-implant regions 111 are formed at the peripheries of the second diffusion layers 11b, and the pMOS transistors thus have an asymmetric impurity profile, is the same as in mode of embodiment 3. Other aspects of the configuration are the same as in mode of embodiment 3.

Figure 14:
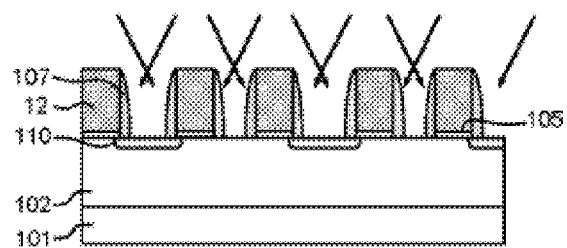
FIG. 14 is a process cross-sectional view corresponding to A-A' in FIG. 5, illustrating schematically an example of a method of manufacturing the pMOS transistors in the sub-word line drivers in the peripheral circuits in the semiconductor device according to mode of embodiment 4 of the present invention.
Figure 14:
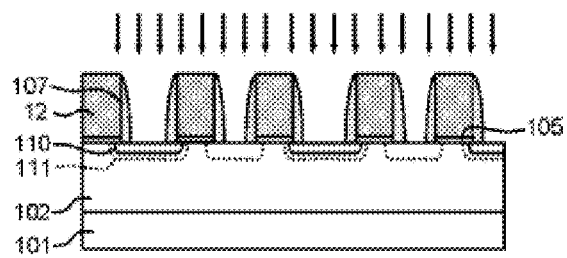
Figure 14:
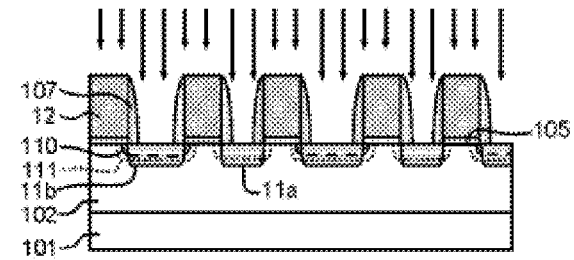
Figure 15:
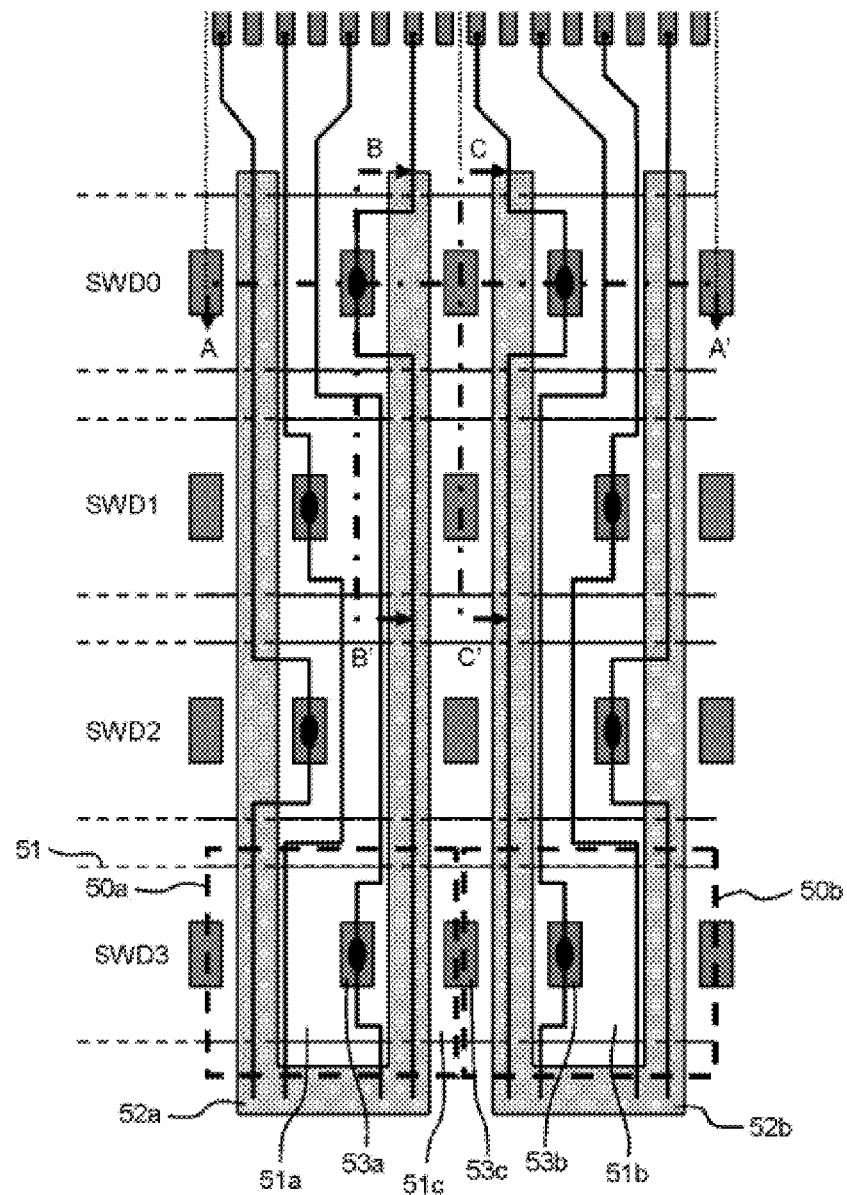
FIG. 15 is a drawing illustrating an example of electrical connections between wiring lines and pMOS transistors in sub-word line drivers in peripheral circuits in a semiconductor device according to the prior art.
Figure 16:
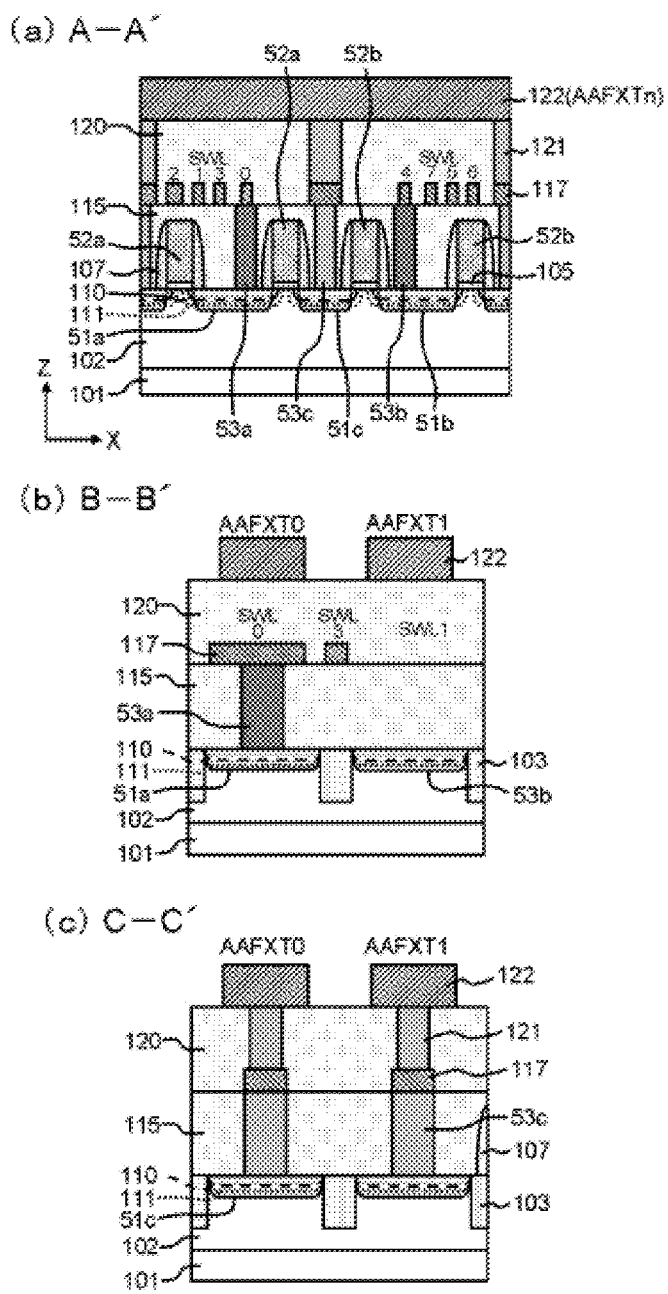
FIG. 16 illustrates schematically an example of the configuration of the pMOS transistors in the sub-word line drivers in the peripheral circuits in the semiconductor device according to the prior art, being cross-sectional views through (a) A-A', (b) B-B' and (c) C-C' in FIG. 15.

A method of manufacturing the pMOS transistors in the sub-word line drivers in the peripheral circuits in the semiconductor device according to mode of embodiment 4 of the present invention will now be described with reference to the drawings. FIG. 14 is a process cross-sectional view corresponding to A-A' in FIG. 5, illustrating schematically an example of a method of manufacturing the pMOS transistors in the sub-word line drivers in the peripheral circuits in the semiconductor device according to mode of embodiment 4 of the present invention.

An n-well 102 (for example a region in which phosphorus has been dispersed) is first formed on a semiconductor substrate 101 (for example a silicon substrate), after which gate electrodes 12 (for example titanium nitride) are formed on the n-well 102 with the interposition of gate insulating films 105 (for example a silicon dioxide film), after which portions of the gate electrodes 12 and the gate insulating films 105 are removed by lithography and dry etching, after which an insulating film (for example a silicon nitride film) for side wall spacers 107 is deposited over the entire surface of the substrate, including the n-well 102, the gate electrodes 12 and the gate insulating films 105, after which said insulating film is etched back to form the side wall spacers 107 on the sidewall surfaces at the inner peripheries of the frame shapes of the gate electrodes 12 and the gate insulating films 105, and at the outer peripheries of said frame shapes (step D1).

Extension regions 110 are then formed only in the regions in which second diffusion layers (11b in FIG. 14) are to be formed, by implanting an impurity (for example boron B) into the exposed n-well 102 with a prescribed tilt angle, after which carbon C is implanted only into the extension regions 110, with a prescribed tilt angle (step D2; see FIG. 14 (a)).

Here, the prescribed tilt angle used when forming the extension regions 110 is set to an angle whereby extension regions 110 are formed only in the regions in which the second diffusion layers (11b in FIG. 14) are to be formed, but extension regions 110 are not formed in the regions in which the first diffusion layers (11a in FIG. 14) are to be formed (alternatively, the tilt angle may also be set in such a way that the impurity concentration in the extension regions 110 associated with the first diffusion layers (11a in FIG. 14) is weaker than the impurity concentration in the extension regions 110 associated with the second diffusion layers (11b in FIG. 14)).

The prescribed tilt angle used when implanting the carbon C is set to an angle whereby carbon C is not implanted into regions in which the first diffusion layers (11a in FIG. 14) are to be formed (or the dose in the extension regions 110 is significantly reduced), but carbon C is implanted into the extension regions 110 in regions in which the second diffusion layers (11b in FIG. 14) are to be formed (alternatively, the tilt angle may also be set in such a way that the concentration is significantly stronger than in the regions in which the second diffusion layers (11b in FIG. 14) are to be formed). It should be noted that the separation between the gates in the peripheral circuits is set to be wider that the separations S1 in the X-direction between the gate electrodes 12, inside the frame shapes of the gate electrodes, and therefore carbon C is implanted symmetrically into the extension regions in both the sources and the drains of the transistors in the peripheral circuit portion.

Pocket-implant regions 111 are then formed in the regions in which both the first diffusion layers (11a FIG. 14) and the second diffusion layers (11b in FIG. 14) are to be formed, by implanting an impurity (for example phosphorus) into the n-well 102 in a position that is deeper than the extension regions 110, using a tilt angle of 0 degrees (step D3; see FIG. 14 (b)).

Here, the reason why the pocket-implant regions 111 are implanted using a tilt angle of 0 degrees is so that the pocket-implant regions 111 are formed in the regions in which both the first diffusion layers (11a in FIG. 14) and the second diffusion layers (11b in FIG. 14) are to be formed.

The first diffusion layers 11a and the second diffusion layers 11b are then formed by implanting an impurity (for example boron B) into the n-well 102 from the exposed extension regions 110 and the pocket-implant regions 111, with a tilt angle of 0 degrees (step D4; see FIG. 14 (c)).

Interlayer insulating films, contact plugs and wiring lines are then formed using conventional methods (step D5). In this way it is possible to manufacture pMOS transistors in which the width of the first diffusion layers 11a is less than the width of the second diffusion layers 11b, and in which, in the sub-word line drivers, the profiles of the extension regions 110 are asymmetrical, such as those in FIG. 13.

According to mode of embodiment 4, GIDLs can be reduced while the ON current Ion of the pMOS transistors is maintained. Further, the gate length of the sub-word drivers SWD can be scaled down, and the chip size can therefore be scaled down. It is possible for transistors having an asymmetric impurity profile, in which the concentration (carbon C) in the extension regions 110 in the first diffusion layers 11a inside the frame shapes of the gate electrodes 12 is low, and the concentration (carbon C) in the extension regions in the second diffusion layers 11b outside the frame shapes is high, to be formed in the sub-word drivers SWD by self alignment, and simultaneously for transistors having a symmetric impurity profile to be formed in the peripheral circuit portions, without increasing the number of ion implantation masks. As a result, GIDLs generated in the diffusion layers 11a and 11b inside the frame shapes in the sub-word drivers SWD can be reduced.

Further, according to mode of embodiment 4, by forming the pocket-implant regions 111 in the diffusion layers 11a and 11b both inside the frame shapes of the gate electrodes 12 and outside said frame shapes, short channel effects can be suppressed, transistors having a shorter channel can be formed, and the chip surface area can be scaled down. To elaborate, by reducing the surface area of the chip that is occupied by the sub-word drivers SWD, the DRAM chip surface area can be scaled down, and the performance of the transistor can be improved.

Further, according to mode of embodiment 4, in the peripheral circuit portions, the extension regions 110 and pocket-implant regions 111 can be formed using the same ion implantation, and the capabilities of the transistor can be maintained without increasing the cost.

Moreover, according to mode of embodiment 4, there is no increase in the number of masks used when implanting ions into the extension regions and the pocket-implant regions in the peripheral circuit portions, and therefore the cost does not increase.

It should be noted that where drawing reference codes have been assigned in this application, this is solely to aid understanding, and does not imply that the present invention is to be limited to the modes illustrated in the drawings.

Further, within the framework of the entire disclosure of the present invention (including the scope of the claims and the drawings), and on the basis of its basic technical concepts, modifications and adjustments may be made to the modes of embodying the invention and to exemplary embodiments thereof. Further, various combinations of and selections from the various disclosed elements (including for example each element of each claim, each element of each mode of embodiment or exemplary embodiment, and each element of each drawing) are possible within the framework of the scope of the claims in the present invention. In other words, it goes without saying that the present invention includes various variations and modifications that could be arrived at by one skilled in the art in accordance with the entire disclosure and technical concepts therein, including the scope of the claims and the drawings. In particular, with regard to ranges of numerical values set forth herein, arbitrary numerical values or sub-ranges contained within said ranges should be interpreted as being specifically set forth, even if not otherwise set forth.

(Appendix)

In one aspect of the present invention, a semiconductor device is provided with a plurality of unit transistors comprising: element isolation regions formed on a semiconductor substrate; and a gate electrode which is formed in the shape of a frame and is disposed on an active region sandwiched between the element isolation regions, in such a way that the two ends of the outer periphery of the gate electrode extend onto the element isolation regions and the inner periphery thereof closes the active region; wherein the active regions of unit transistors adjacent to one another in a first direction are electrically isolated from one another by means of the element isolation regions, and the active regions of unit transistors adjacent to one another in a second direction which intersects the first direction are linked to one another.

The semiconductor device of the present invention, wherein at least four of the gate electrodes are disposed on the element isolation regions in such a way that pairs of gate electrodes adjacent to one another in the first direction are in contact with one another, and the gate electrodes adjacent to one another in the second direction are disposed with a prescribed separation.

The semiconductor device of the present invention, wherein the separation between the gate electrodes in the second direction inside the frame shape of the gate electrodes is the same as the separation between the gate electrodes in the second direction outside the frame shape of the gate electrodes.

The semiconductor device of the present invention, wherein the separation between the gate electrodes in the second direction inside the frame shape of the gate electrodes is less than the separation between the gate electrodes in the second direction outside the frame shape of the gate electrodes.

The semiconductor device of the present invention, provided with side wall spacers formed on the respective sidewall surfaces at the inner periphery of the frame shape of the gate electrodes and the outer periphery of the frame shape.

The semiconductor device of the present invention, provided with: a well having a first conduction type, formed on the semiconductor substrate; a first diffusion layer of a second conduction type which is the opposite of the first conduction type, formed on the well in a region inside the frame shape of the gate electrodes; and a second diffusion layer of the second conduction type, formed on the well in a region outside the frame shape of the gate electrodes.

The semiconductor device of the present invention, provided with: a second extension region of the second conduction type, the impurity concentration of which is lower than that of the second diffusion layer, and which is disposed in contact with the second diffusion layer in a region between the channel of the unit transistor and the second diffusion layer; and a second pocket-implant region of the first conduction type, the impurity concentration of which is higher than that of the well, and which is disposed in contact with the second diffusion layer and the second extension region in a location that is deeper than the second extension region, in a region between the channel of the unit transistor and the second diffusion layer.

The semiconductor device of the present invention, provided with: a first extension region of the second conduction type, the impurity concentration of which is lower than that of the first diffusion layer, and which is disposed in contact with the first diffusion layer in a region between the channel of the unit transistor and the first diffusion layer; and a first pocket-implant region of the first conduction type, the impurity concentration of which is higher than that of the well, and which is disposed in contact with the first diffusion layer and the first extension region in a location that is deeper than the first extension region, in a region between the channel of the unit transistor and the first diffusion layer.

The semiconductor device of the present invention, provided with a first pocket-implant region of the first conduction type, the impurity concentration of which is higher than that of the well, and which is disposed in contact with the first diffusion layer in a region between the channel of the unit transistor and the first diffusion layer.

The semiconductor device of the present invention, provided with: a plurality of word drivers provided with a plurality of the unit transistors; and a plurality of word lines electrically connected to the word drivers.

The semiconductor device of the present invention, wherein: the first diffusion layers are electrically connected to corresponding word lines; the second diffusion layer is electrically connected to a corresponding output signal line; and the gate electrodes are electrically connected to corresponding address signal lines.

The semiconductor device of the present invention, wherein: the word lines extend in the first direction and are disposed side-by-side in the second direction, and the word drivers are disposed side-by-side in the first direction and the second direction.

The semiconductor device of the present invention, wherein each of the word drivers aligned side-by-side in the first direction is electrically connected to a common address signal line.

The semiconductor device of the present invention, wherein each of the word drivers aligned side-by-side in the second direction is electrically connected to a common output signal line.

EXPLANATION OF THE REFERENCE CODES

10 Unit transistor
11 Active region
11a First diffusion layer
11b Second diffusion layer
12 Gate electrode
12a First channel portion
12b Second channel portion
12c First connecting portion
12d Second connecting portion
13, 13a, 13b Contact plug
50a First unit transistor
50b Second unit transistor
51 Active region
51a, 51b First diffusion layer
51c Second diffusion layer
52a, 52b Gate electrode
53a, 53b, 53c Contact plug
101 Semiconductor substrate
102 n-well (first conduction type)
103 Element isolation region
105 Gate insulating film
107 Side wall spacer
110 Extension region
111 Pocket-implant region (first conduction type)
115 First interlayer insulating film
117 Wiring line
120 Second interlayer insulating film
121 Contact plug
122 Wiring line
125 Resist
MCA Memory cell array
MC Memory cell
Xdec Row decoder
MWD Main-word driver
SWD Sub-word driver
SWLD, SWLD0 to 7 Sub-word line driver
SWL, SWL0 to 7 Sub-word line
Ydec Column decoder
SAA Sense amplifier array SA Sense amplifier
BL Bit line
MWLB0 to 1 Address signal
AAFXT0 to 3 Output signal
ARFXB0 to 3 Complementary output signal
Q00 to 07 pMOS transistor
Q10 to 17 nMOS transistor
Q20 to 27 nMOS transistor

What is claimed is:

1. A semiconductor device provided with a plurality of unit transistors comprising:
   element isolation regions formed on a semiconductor substrate; and
   a gate electrode which is formed in the shape of a frame and is disposed on an active region sandwiched between the element isolation regions, in such a way that the two ends of the outer periphery of the gate electrode extend onto the element isolation regions and the inner periphery thereof closes the active region;
   wherein the active regions of unit transistors adjacent to one another in a first direction are electrically isolated from one another by means of the element isolation regions, and the active regions of unit transistors adjacent to one another in a second direction which intersects the first direction are linked to one another.

2. The semiconductor device as claimed in claim 1, wherein at least four of the gate electrodes are disposed on the element isolation regions in such a way that pairs of gate electrodes adjacent to one another in the first direction are in contact with one another, and wherein the gate electrodes adjacent to one another in the second direction are disposed with a prescribed separation.

3. The semiconductor device as claimed in claim 2, wherein the separation between the gate electrodes in the second direction inside the frame shape of the gate electrodes is the same as the separation between the gate electrodes in the second direction outside the frame shape of the gate electrodes.

4. The semiconductor device as claimed in claim 2, wherein the separation between the gate electrodes in the second direction inside the frame shape of the gate electrodes is less than the separation between the gate electrodes in the second direction outside the frame shape of the gate electrodes.

5. The semiconductor device as claimed in claim 1, further comprising side wall spacers formed on the respective sidewall surfaces at the inner periphery of the frame shape of the gate electrodes and the outer periphery of the frame shape.

6. The semiconductor device as claimed in claim 1, further comprising:
   a well having a first conduction type, formed on the semiconductor substrate;
   a first diffusion layer of a second conduction type which is the opposite of the first conduction type, formed on the well in a region inside the frame shape of the gate electrodes; and
   a second diffusion layer of the second conduction type, formed on the well in a region outside the frame shape of the gate electrodes.

7. The semiconductor device as claimed in claim 6, further comprising:
   a second extension region of the second conduction type, the impurity concentration of which is lower than that of the second diffusion layer, and which is disposed in contact with the second diffusion layer in a region between the channel of the unit transistor and the second diffusion layer; and
   a second pocket-implant region of the first conduction type, the impurity concentration of which is higher than that of the well, and which is disposed in contact with the second diffusion layer and the second extension region in a location that is deeper than the second extension region, in a region between the channel of the unit transistor and the second diffusion layer.

8. The semiconductor device as claimed in claim 7, further comprising:
   a first extension region of the second conduction type, the impurity concentration of which is lower than that of the first diffusion layer, and which is disposed in contact with the first diffusion layer in a region between the channel of the unit transistor and the first diffusion layer; and
   a first pocket-implant region of the first conduction type, the impurity concentration of which is higher than that of the well, and which is disposed in contact with the first diffusion layer and the first extension region in a location that is deeper than the first extension region, in a region between the channel of the unit transistor and the first diffusion layer.

9. The semiconductor device as claimed in claim 7, further comprising a first pocket-implant region of the first conduction type, the impurity concentration of which is higher than that of the well, and which is disposed in contact with the first diffusion layer in a region between the channel of the unit transistor and the first diffusion layer.

10. The semiconductor device as claimed in claim 6, further comprising:
    a plurality of word drivers provided with a plurality of the unit transistors; and
    a plurality of word lines electrically connected to the word drivers.

11. The semiconductor device as claimed in claim 10, wherein:
    the first diffusion layers are electrically connected to corresponding word lines;
    the second diffusion layer is electrically connected to a corresponding output signal line; and
    the gate electrodes are electrically connected to corresponding address signal lines.

12. The semiconductor device as claimed in claim 10, wherein:
    the word lines extend in the first direction and are disposed side-by-side in the second direction, and
    the word drivers are disposed side-by-side in the first direction and the second direction.

13. The semiconductor device as claimed in claim 12, wherein each of the word drivers aligned side-by-side in the first direction is electrically connected to a common address signal line.

14. The semiconductor device as claimed in claim 12, wherein each of the word drivers aligned side-by-side in the second direction is electrically connected to a common output signal line.

* * * * *